United States Patent [19]

Kobayashi

[11] 3,925,803

[45] Dec. 9, 1975

[54] ORIENTED POLYCRYSTAL JFET

[75] Inventor: Isamu Kobayashi, Yokohama, Japan

[73] Assignee: Sony Corporation, Tokyo, Japan

[22] Filed: July 12, 1973

[21] Appl. No.: 378,449

[30] Foreign Application Priority Data

July 13, 1972 Japan ................................ 47-70225

[52] U.S. Cl. .................. 357/22; 148/175; 148/187; 357/14; 357/41; 357/59

[51] Int. Cl.$^2$ .................. H01L 21/365; H01L 29/80

[58] Field of Search.... 317/235 A, 235 AT; 357/22, 357/59, 41

[56] References Cited

UNITED STATES PATENTS

| | | | |
|---|---|---|---|
| 2,954,307 | 9/1960 | Shockley | 317/235 A |
| 2,979,427 | 4/1961 | Shockley | 317/235 A |
| 3,128,530 | 4/1964 | Rouse et al. | 317/235 A |
| 3,274,461 | 9/1966 | Teszner | 317/235 A |
| 3,332,810 | 7/1967 | Kamura | 317/235 AT |
| 3,442,823 | 5/1969 | Mueller et al. | 317/235 AT |
| 3,624,467 | 11/1971 | Bean et al. | 317/235 AT |

*Primary Examiner*—William D. Larkins
*Attorney, Agent, or Firm*—Lewis H. Eslinger; Alvin Sinderbrand

[57] ABSTRACT

A junction field effect transistor in which the source and drain electrodes are connected by a large number of exceedingly slender rod-shaped semiconductor crystals grown side by side parallel to each other and each having an outer sheath of opposite conductivity semiconductor material. Each crystal and its sheath have a P-N junction between them and all of the sheaths are connected together to a gate terminal. Application of a gate voltage to this terminal causes a depletion layer within each rod-shaped crystal to constrict the charge-carrying path through the crystal to an extent determined by the magnitude of the gate voltage. The rod-shaped crystals are grown in such a way that individual rod-shaped crystals are formed rather than a single crystal of large area.

6 Claims, 17 Drawing Figures

ORIENTED POLYCRYSTAL JFET

BACKGROUND OF THE INVENTION

1. Field of the Invention

This invention relates to a semiconductor device and particularly to a device fabricated by utlizing polycrystal growing techniques.

2. Description of the Prior Art

Multichannel field effect transistors, first proposed by Shockley as analogue transistors, are described in detail by Zuleeg in Solid-State Electronics (1967), Volume 10, pp. 559—576. As described in that publication, the multichannel field effect transistor has many advantages. An important advantage is that it is capable of handling relatively high power. Another is that it has a high transconductance.

However, the multichannel field effect transistor as described by Zuleeg requires photographic formation of a large number of fine channels, which are difficult to produce. As a result, the device is rather large and is not suitable for construction as part of an integrated circuit. Thus, some of the theoretical advantages are not realized in practice.

It is therefore one of the objects of the present invention to provide an improved multichannel field effect transistor and an improved method of constructing the same.

Another object is to provide a multichannel field effect transistor having finer channels than can be produced by photographic techniques.

A further object of the invention is to provide a multichannel field effect transistor in which the channels lend themselves better to constriction of movement of charge carriers, thus resulting in a high transconductance.

Further objects will become apparent after studying the following specification together with the drawings.

SUMMARY OF THE INVENTION

In accordance with the present invention, the technique of producing polycrystals is used to grow a large number of fine channels in a bundle suitable for use as a field effect transistor. The fine channels are actually rod-shaped single crystals grown on a substrate by a vapor growth method. Source and drain electrodes are formed at opposite ends of the channels, and opposite conductivity material is diffused into the bundle of rod-shaped crystals to form a sheath for each rod in order to create a P-N junction along each rod. A gate connection is made to all of the sheaths so that a suitable gate voltage will create a depletion layer in each rod to constrict the longitudinal charge-carrying path through each rod from source to drain. The resulting structures can also be used as variable resistors and variable capacitors in addition to their normal use as multichannel field effect junction type transistors.

DETAILED DESCRIPTION OF THE INVENTION

In accordance with the present invention a polycrystalline structure is formed as a bundle of slender, rod-shaped single crystals with a crystalline discontinuity at the grain boundary separating each crystal from its neighbors. The cross-sectional dimensions of each rod-shaped single crystal are generally in the range from about 1$\mu$m to 10m $\mu$m in diameter with the exact dimensions depending on the method for making the polycrystal and on the conditions involved in that method. This sort of polycrystal can be grown on a single crystal or on a non-crystalline substrate used for a nucleus for growth. Polycrystals of silicon can be formed in accordance with standard technology by applying a vapor growth technique using silane ($SiH_4$) or silicon tetrachloride ($SiCl_4$) or the like.

Figure 1:
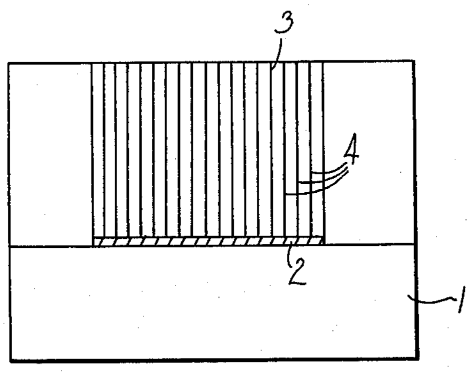
FIG. 1 shows an example of the growth of polycrystals on a substrate to form a multichannel structure in accordance with the present invention.

FIG. 1 shows a polycrystalline structure including a substrate 1, a layer of nuclei 2, and a plurality of slender rod-shaped crystals 3, grown from the nuclei. The rod-shaped crystals 3 are separated from each other by boundaries 4. The crystalline nature of the substrate 1 does not necessarily affect the crystalline nature of the rod-shaped crystals 3, which may be referred to as a polycrystal, and accordingly, many types of substrates can be used for the substrate. For example, the substrate may consist of a semiconductor, such as silicon (Si) or it may consist of sapphire (Al-O), spinel (mg-Al-O), quartz (Si-O). It may also consist of a high melting point metal such as molybdenum or tungsten. Since the substrate 1 will be heated to quite a high temperature during the growing of the polycrystal 3, the substrate must be made of a material that withstands the temperature and has minimal distortion due to thermal expansion and contraction and shows no chemical reaction with the polysilicon normally used to form the polycrystal 3. Silicon, itself, is very suitable as a substrate 1, but germanium or other semiconductor materials can also be used. When a single crystal substance is used as the substrate 1, the growth of the polycrystal 3 on top of the substrate must be carried out under conditions that do not permit the material that goes into the making of the polycrystal 3 to grow as a large single crystal but, instead, forces it to grow as a bundle of slender rods closely packed together and parallel to each other. Alternatively, the use of a noncrystalline substance or a fine crystal as a nucleus for growth can prevent the growth of the polycrystal 3 as a single crystal. If a thermal method is to be used to grow the polycrystal, silane may be introduced into the growing chamber and the temperature must be controlled so as to be between approximately 500°C. and 950°C. The lower temperature is that at which the vapor of silane exists in molecular form while the higher temperature is that at which the silicon that is supposed to grow into the polycrystal 3 may grow as a large single crystal. If a chemical method is to be used, silicon tetrachloride may be applied to grow the polycrystal 3 and the temperature held between approximately 870°C. and 1100°C. Alternatively, dichloro silane ($SiH_2Cl_2$) may be used, and the temperature held between approximately 700°C. and 1000°C. After initial growth of the polycrystal as a nucleus 2, the temperature is changed so as to be high enough to grow the rod-shaped polycrystal in single crystal form rather than as granules.

Figure 2:
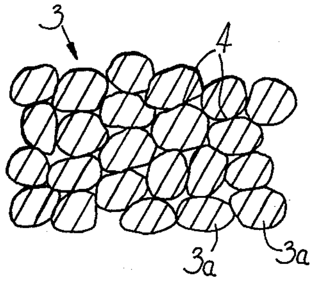
FIG. 2 is a top view of the polycrystalline structure shown in FIG. 1.

Subsequently, an impurity is diffused in the polycrystal 3, the diffusion length of which is recognized as being fairly high at the grain boundary 4 between adjacent rod-shaped crystals in the polycrystal 3. Because the polycrystal 3 is a bundle of many single crystals, the diffusion of the impurity proceeds along the grain boundaries 4 into the bundle of the individual crystals 3a as shown in FIG. 2. The diffusion length is known to be as much as approximately three times that of the single crystal and the diffusion co-efficient is as much as approximately ten times that of a single crystal.

Figure 3:
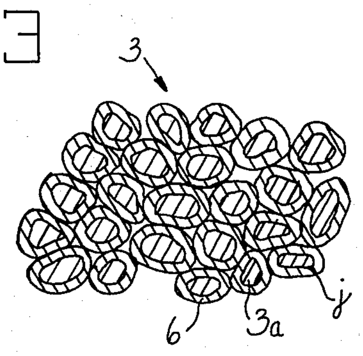
FIG. 3 is the structure of FIG. 2 after diffusion of an impurity into an outer layer of each elemental crystal.

Due to the diffusion, a P-N junction is formed in each rod-shaped crystal **3*a* as shown in FIG. 3 and is parallel to the longitudinal direction, that is the direction of growth of the polycrystal 3.** The junctions *j* are indicated in FIG. 3 between the core of the rod-shaped crystals **3*a* and a sheath 6** formed by the diffused impurity around each core. The resulting structure has a high withstand voltage and a small capacitance in comparison with the conventional P-N junction in a single crystal.

Figure 4:
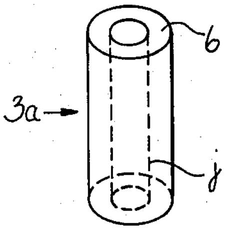
FIG. 4 is prespective view of an idealized rod-shaped single crystal of the type shown in FIG. 3.

FIG. 4 shows an individual rod-shaped single crystal **3*a* separate from the bundle of rod-shaped crystals 3 in any one of FIGS. 1–3.** It is clear that the P-N junction *j* extends along the length of the rod-shaped crystal **3*a* between the core and the diffusion region 6 that surrounds the core. It is the core that serves as a conduction channel for charge carriers travelling longitudinally along the rod-shaped crystal 3*a*.** Once a backward bias voltage is applied to the junction *j*, a depletion layer extends from the junction 5 to the inside of the single crystal **3*a* so that the cross-sectional area of the longitudinal conduction channel through the crystal 3*a*** becomes smaller.

Even without impurity diffusion, the polycrystal 3 in FIG. 1 shows its rectifier characteristics due to the discontinuity of the grain boundary and has a large withstand voltage of the junction and a lower junction capacitance than an ordinary single crystal because of the generation of the depletion layer. Although the non-diffusion region at the center of each of the rod-shaped crystals **3*a*** serves as a conduction channel, the cross-sectional area of this conduction channel is controlled in response to the location, or extent, of the depletion layer that is produced when a backward bias voltage is applied. The change that results in the depletion layer is a function of the magnitude of the backward bias voltage. Due to the capacitance that exists between the two components, this kind of semiconductor can also be used as a variable capacitance device, the capacitance of which changes in response to the value of the backward bias voltage.

Figure 5:
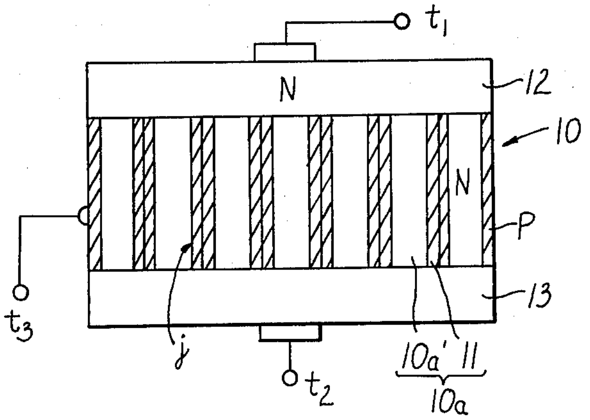
FIG. 5 shows a field effect transistor structure according to the present invention.

FIG. 5 is representative of a multichannel field effect transistor according to the present invention. In FIG. 5 an N-type polycrystalline region 10 consisting of many rodshaped single crystals **10*a* is formed, and then a P-type impurity substance is diffused through the grain boundaries in the polycrystalline region 10 into each rod-shaped single crystal 10*a*** from the side outer face of the polycrystalline device. This diffusion causes a P-N junction *j* to be formed between each P-type impurity diffusion region 11 and the N-type internal region of each rod-shaped single crystal **10*a*. Additional N-type semiconductor regions 12 and 13 are located at the ends of the polycrystalline region 10 and terminals $t_1$ and $t_2$ are applied thereto as source and drain terminals. A gate terminal $t_3$ makes an ohmic contact with the P-type impurity diffusion region 11 of all of the rod-shaped single crystals in the polycrystalline region 10.**

The device shown in FIG. 5 operates as follows: The conduction channel between the terminals $t_1$ and $t_2$, that is between the N-type semiconductor regions 12 and 13, is through the central part of the N-type regions in the individual rod-shaped crystals **10*a*. The cross-section of each of these conduction channels in initially controlled by the cross-sectional area of the N-type region but, when a backward bias voltage is applied to the gate electrode $t_3$, depletion layers are formed in the central regions of each rod-shaped crystal 10*a*** to a depth controlled by the amplitude of the backward bias voltage.

Figure 6:
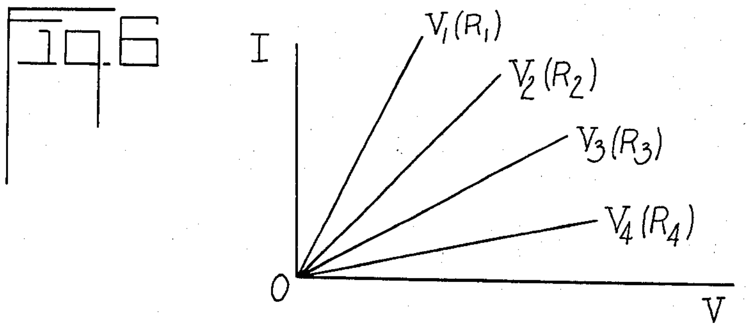
FIG. 6 is a graph of the voltage and current relationships of the device in FIG. 5 under different conditions.

The static characteristics of the semiconductor device of FIG. 5 are shown in FIG. 6. The current-voltage (I-V) characteristics for different backward bias voltages $V_1$–$V_4$ are indicated. The slope of each of these characteristic lines corresponds to an equivalent resistance between the terminals $t_1$ and $t_2$, and as may be seen, the value of the equivalent resistance is determined by the value of the backward bias voltage.

The production of a junction type multichannel field effect transistor is explained in greater detail in connection with FIGS. 7A – 7E′. FIGS. 7A – 7E show side or cross-sectional views at different stages of manufacture, and FIGS. 7A′ – 7E′ show plan views at the corresponding stages of manufacture.

Figure 7A:
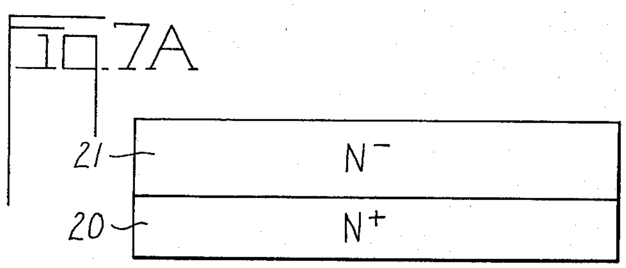
FIGS. 7A–7E' illustrate a series of steps in the manufacture of field effect transistors according to the present invention.
Figure 7A:
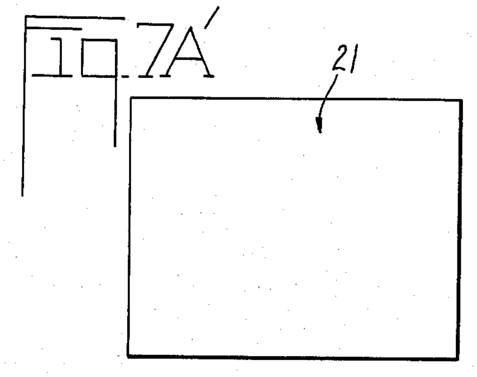

In FIGS. 7A and 7A′ a highly doped N-type single crystal semiconductor substrate 20 is first prepared. The impurity level is indicated by the symbol N +. A low-doped N-type semiconductor region 21 is grown on the surface of the substrate 20 by a vapor growth method.

Figure 7B:
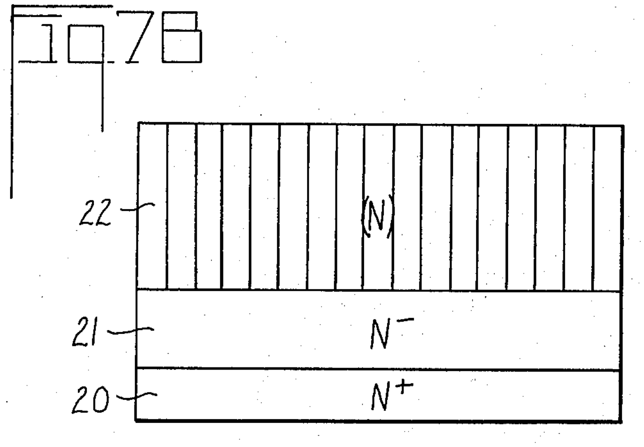
Figure 7B:
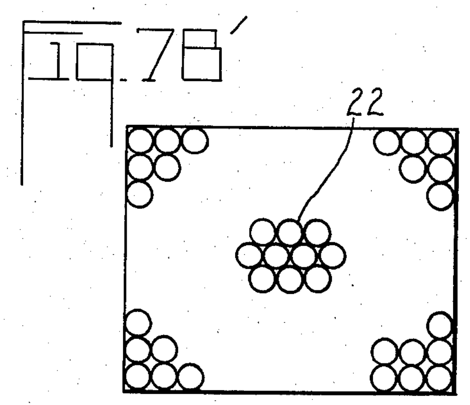

As shown in FIGS. 7B and 7B′, a polycrystalline region 22 is grown on the exposed surface of the semiconductor region 20, utilizing a thin layer of nuclei or the growth techniques described hereinbefore.

Figure 7C:
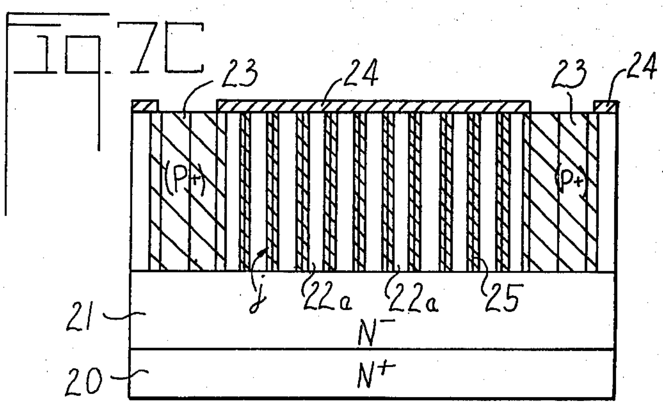
Figure 7C:
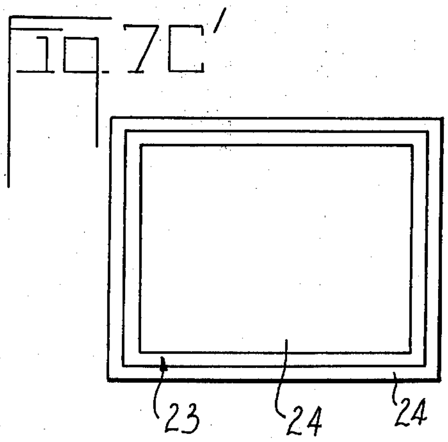

As shown in FIGS. 7C and 7C′, an insulating film 24 such as silicon dioxide ($SiO_2$) is then applied to the exposed surface of the polycrystalline region 22 to serve as a diffusion mask. A P-type impurity is diffused through openings in the mask to produce highly doped P-type impurity diffusion regions 23. The P-type impurity also diffuses along the grain boundaries between the individual rod-shaped crystals **22*a* to form a sheath 25** around each of these crystals. Thus, there is a P-N junction *j* within each rod-shaped crystal **22*a*.** Sometimes the junctions *j* are formed continuously between two adjacent rod-shaped crystals.

Figure 7D:
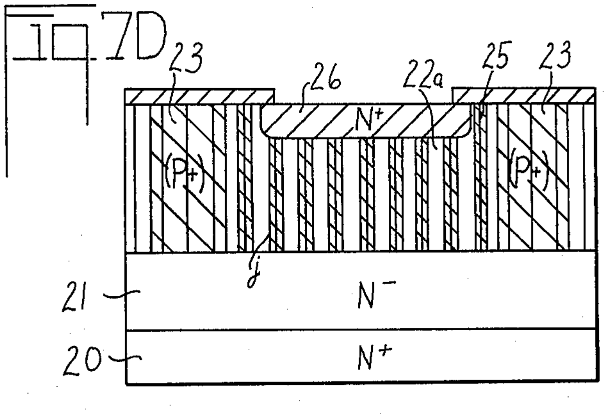
Figure 7D:
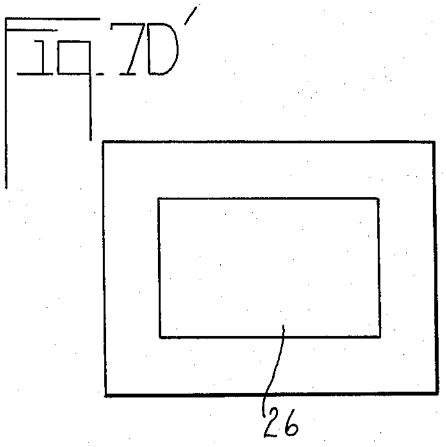

FIGS. 7D and 7D′ show a further processing step in which a different mask is applied to the upper surfaces of the region containing the rod-shaped crystals **22*a*. This mask permits a highly doped N-type diffusion region 26 to be formed at selected regions on the upper part of the polycrystal region 22 at the end of each of the individual rod-shaped crystals 22*a*.**

Figure 7E:
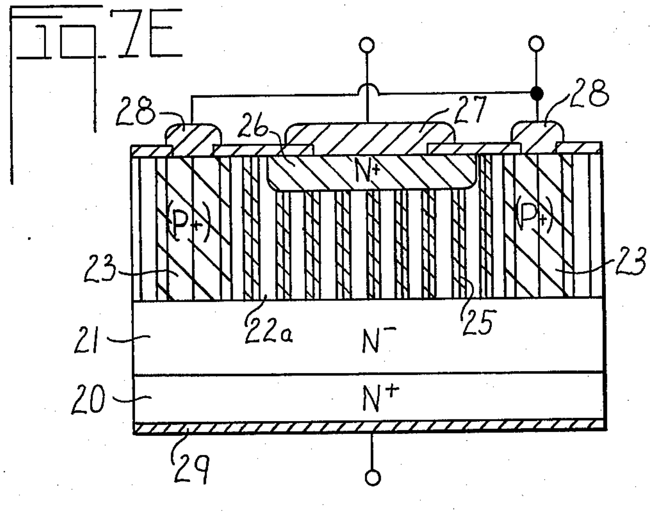
Figure 7E:
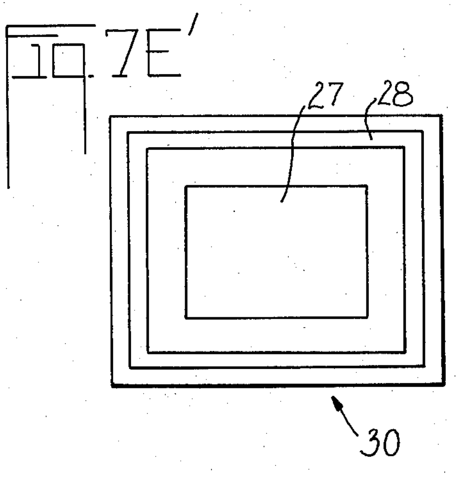

FIGS. 7E and 7E′ show the step of applying a metal layer 27 to an exposed surface of the highly doped N-type diffusion region 26 as a source electrode. Two other metal layers 28 are applied to exposed ends of the highly doped diffusion regions 23 and are connected together to form the gate electrode, and a further metal layer 29 is applied to the lower surface of the substrate 20 and is a drain electrode. This completes the junction type field effect transistor 30.

In the transistor 30, as in the embodiment previously discussed, the bias voltage applied to the gate electrode, in this case, the electorde 28, determines the depth of the depletion layer in each of the rod-shaped crystals 22*a* and thus controls the cross-sectional area of each conduction channel through the respective crystals. This controls the current flowing between the source electrode 27 and the drain electrode 29.

Even if the impurity material does not diffuse uniformly into the polycrystal region 22 in the step shown in FIG. 7C, each grain boundary between adjacent rod-shaped crystals 22*a* has rectifier characteristics as described hereinabove. This phenomenon appears particularly under the condition that the polycrystalline region 22 includes impurities less than $10^{17}$ atoms/cm$^3$.

The junction type field effect transistor 30 shown in FIG. 7E is suitable for a high power transistor and for a transistor that requires a high withstand voltage because the current flows through a large number of conduction channels. In addition, low doped N-type semiconductor material in the region 21 is disposed adjacent the polycrystalline region 22. The semiconductor device 30 may be fabricated as a single device or as part of an integrated circuit. It can also be fabricated simultaneously with other devices, for example, bipolar transistors, because the polycrystalline region 22 can be formed selectively.

Figure 8:
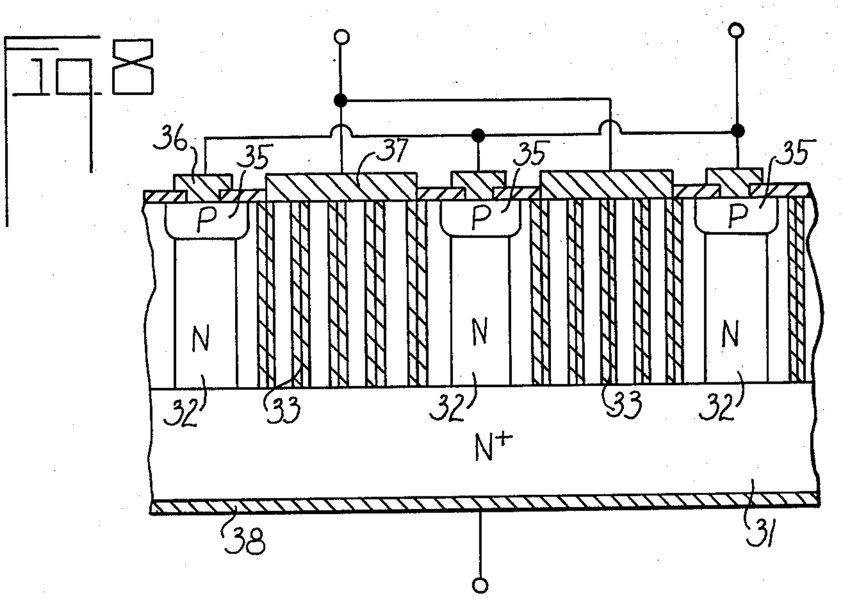
FIG. 8 shows another embodiment of the field effects transistor according to the present invention.

FIG. 8 shows another embodiment of a junction type field effect transistor constructed according to the present invention. A highly doped N-type semiconductor substrate 31 is used, and a single crystal layer 32 and a polycrystal layer 33 are formed simultaneously on the substrate 31 by utilizing a vapor growth method. In such a method, the single crystal layer 32 is formed as a grid to separate the polycrystal layer 33 into cells. The whole vapor growth region is identified by reference numeral 34.

Next, a P-type impurity is diffused through a mask having a window that extends beyond the single crystal region 32. As a result, when the P-type diffusion region 35 is formed through this window, the P-type impurity will also be diffused into the polycrystal layer 33 to make a P-N junction with it. After that, a gate electrode 36*m* a source electrode 37, and a drain electrode 38 are disposed on the region 35, the upper ends of the rod-shaped crystals in the polycrystalline layer 33, and the lower surface of the substrate 31, respectively, in order to complete the production of a transistor 39 in accordance with this invention.

What is claimed is:

1. A semiconductor device comprising:

A. a polycrystalline region comprising a plurality of slender, rod-shaped semiconductor crystals grown simultaneously in a closely packed group substantially parallel to each other and having grain boundaries therebetween, said crystals being of one conductivity type;

B. a sheath comprising an impurity layer of the opposite conductivity type along the length of each of said crystals to form, with the central crystalline material of the respective rod-shaped crystal, a P-N junction;

C. a first electrode connected to one end of said crystals;

D. a second electrode connected to said sheath;

E. a third electrode connected to the other end of said crystals.

2. The semiconductor device of claim 1 comprising, in addition, a semiconductor substrate at one end of said rod-shaped crystals, said first electrode being formed on said substrate.

3. The semiconductor device of claim 1 in which said first electrode comprises a source electrode, said second electrode comprises a gate electrode, and said third electrode comprises a drain electrode.

4. The semiconductor device of claim 3 comprising, in addition, an inpurity diffusion layer on each of said rod-shaped crystals at said grain boundaries, said second electrode being connected to said impurity diffusion layer.

5. The semiconductor device of claim 4 comprising, in addition,

A. a semiconductor substrate at one end of said rod-shaped crystals; and

B. a single crystal wall structure grown on said substrate with said rod-shaped crystals to separate groups of said rod-shaped crystals.

6. The semiconductor device of claim 5 in which said substrate, said rod-shaped crystals, and said wall structure are of one conductivity type, and said impurity diffusion layer is of the opposite conductivity type.

* * * * *